US006878981B2

(12) United States Patent
Eshel

(10) Patent No.: US 6,878,981 B2
(45) Date of Patent: Apr. 12, 2005

(54) TRIPLE-WELL CHARGE PUMP STAGE WITH NO THRESHOLD VOLTAGE BACK-BIAS EFFECT

(75) Inventor: Noam Eshel, Pardesiya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 10/393,958

(22) Filed: Mar. 20, 2003

(65) Prior Publication Data

US 2004/0183114 A1 Sep. 23, 2004

(51) Int. Cl.[7] .............................................. H01L 27/108
(52) U.S. Cl. ...................................... 257/299; 327/536
(58) Field of Search ................................. 257/299–300; 363/60; 365/185.18, 189.11; 327/390, 536, 589, 148, 157

(56) References Cited

U.S. PATENT DOCUMENTS

| | | | | |
|---|---|---|---|---|
| 5,386,151 A | * | 1/1995 | Folmsbee | 327/536 |
| 5,768,192 A | | 6/1998 | Eitan | |
| 5,861,772 A | * | 1/1999 | Lee | 327/589 |
| 5,943,271 A | * | 8/1999 | Fujita | 365/189.09 |
| 5,973,979 A | * | 10/1999 | Chang et al. | 365/226 |
| 5,982,224 A | | 11/1999 | Chung et al. | |
| 5,986,947 A | | 11/1999 | Choi et al. | |
| 6,037,622 A | | 3/2000 | Lin et al. | |
| 6,191,963 B1 | | 2/2001 | McPartland et al. | |
| 6,198,342 B1 | * | 3/2001 | Kawai | 327/536 |
| 6,208,200 B1 | * | 3/2001 | Arakawa | 327/589 |
| 6,215,348 B1 | * | 4/2001 | Steensgaard-Madsen | 327/390 |
| 6,466,489 B1 | * | 10/2002 | Ieong et al. | 365/189.09 |
| 6,535,052 B2 | * | 3/2003 | Myono | 327/536 |
| 6,614,699 B2 | * | 9/2003 | Tanzawa | 365/189.11 |
| 6,642,773 B2 | * | 11/2003 | Lin et al. | 327/536 |
| 6,661,682 B2 | * | 12/2003 | Kim et al. | 363/59 |
| 6,674,317 B1 | * | 1/2004 | Chou | 327/536 |
| 2001/0022735 A1 | * | 9/2001 | Zanuccoli et al. | 363/60 |
| 2002/0079952 A1 | * | 6/2002 | Zeng et al. | 327/536 |
| 2002/0084828 A1 | * | 7/2002 | Li | 327/536 |
| 2002/0084829 A1 | * | 7/2002 | Li | 327/536 |

(Continued)

OTHER PUBLICATIONS

"On–Chip High–Voltage Generation in MNOS Intergrated Circuits Using a Improved Voltage Multiplier Technique", by John F. Dickson, pp. 374–378.
"A High–Efficiency CMOS Voltage Doubler" by Pierra Favrat, et al., IEEE Journal of Solid–State Circuits, vol. 33, No. 3, Mar. 1998, pp. 410–416.
"Circuit Techniques for a 1.8–V–Only NAND Flash Memory" by Toru Tanzawa et al., IEEE Journal of Solid-State Circuits, vol. 37, No. 1, Jan. 2002, pp. 84–89.
"A 5–V–Only Operation 0.6–$\mu$m Flash EEPROM with Row Decoder Scheme in Triple–Well Structure" by Akira Umezawa et al., IEEE Journal of Solid–State Circuits, vol. 27, No. 11, Nov. 1992, pp. 1540–1546.

*Primary Examiner*—Long Pham
*Assistant Examiner*—Thao X. Le
(74) *Attorney, Agent, or Firm*—Bever, Hoffman & Harms, LLP; E. Eric Hoffman

(57) ABSTRACT

A charge pump stage includes a first n-channel transistor having a source coupled to an input terminal and a drain coupled to an output terminal. A second n-channel transistor has a source coupled to the input terminal, a drain coupled to a gate of the first transistor, and a gate coupled to the output terminal. A third n-channel transistor has a source coupled to the input terminal, a gate coupled to the output terminal, and a drain coupled to a p-well. A fourth n-channel transistor has a source coupled to the output terminal, a gate coupled to the input terminal, and a drain coupled to the p-well. The first, second, third and fourth transistors are fabricated in the p-well, which is surrounded by an n-well. A first capacitor is coupled to the output terminal, and a second capacitor is coupled to the gate of the first transistor.

9 Claims, 5 Drawing Sheets

U.S. PATENT DOCUMENTS

| | | | |
|---|---|---|---|
| 2002/0130701 A1 * | 9/2002 | Kleveland | 327/536 |
| 2002/0145464 A1 * | 10/2002 | Shor et al. | 327/536 |
| 2002/0190780 A1 * | 12/2002 | Bloch | 327/536 |
| 2003/0006825 A1 * | 1/2003 | Lee et al. | 327/536 |
| 2003/0038670 A1 * | 2/2003 | Li | 327/536 |
| 2003/0057469 A1 * | 3/2003 | Karaki | 257/299 |
| 2003/0214346 A1 * | 11/2003 | Pelliconi | 327/536 |
| 2004/0130387 A1 * | 7/2004 | Marshall | 327/544 |

* cited by examiner

TRIPLE-WELL CHARGE PUMP STAGE WITH NO THRESHOLD VOLTAGE BACK-BIAS EFFECT

FIELD OF THE INVENTION

The present invention relates to a charge pump circuit for generating a voltage on an integrated circuit device. More specifically, the present invention relates to a charge pump circuit having no back-bias effect.

RELATED ART

Electrically erasable and programmable read only memory (EEPROM) devices require various voltages for their operation. For example, microflash SONOS type memory of the type described in U.S. Pat. No. 5,768,192, to Eitan requires a 9 Volt gate voltage for programming, a 4 Volt gate voltage for reading and a −6 Volt gate voltage for erasing. All these voltages are generated internally (i.e., inside the chip) in response to a $V_{DD}$ supply voltage by a charge pump circuit.

FIG. 1 is a circuit diagram of a conventional charge pump circuit 100, introduced by J. Dickson, "On-Chip, High-Voltage Generation in NMOS Integrated Circuits Using an Improved Voltage Multiplier Technique", Journal of Solid-State Circuits, Vol. SC-11, No. 3, pp. 374–378, June 1976."

Charge pump 100 makes use of capacitors 101–104, which are coupled to diode-connected NMOS transistors 111–115 as illustrated. Capacitors 101 and 103 are coupled in parallel to receive clock signal CLK, and capacitors 102 and 104 are coupled in parallel to receive clock signal CLK#. Clock signal CLK# is the inverse of clock signal CLK.

An input voltage $V_{IN}$ is provided to diode-connected transistor 111 and an output voltage $V_{OUT}$ is generated at the output terminal 125 of diode-connected transistor 115. Charge pump 100 operates by pumping charge along diode-connected transistors 111–115 as the capacitors 101–104 are successively charged and discharged during each half clock cycle. The voltages at nodes 121–125 are not reset after each pumping cycle. Consequently, the average potential of nodes 121–125 progressively increases from node 121 to node 125.

Implementing charge pump 100 using conventional CMOS circuitry results in two drawbacks related to the voltage drop on each of diode-connected NMOS transistors 111–115.

First, the threshold voltage loss on each of the diode-connected NMOS transistors 111–115 causes significant efficiency losses, especially at high output voltage levels where these transistors 111–115 are susceptible to large back-bias voltages. The back-bias voltage ($V_{SB}$) is defined as the voltage between the source and the bulk of the transistor. Large back-bias voltages undesirably increase the threshold voltages of the associated transistors. For example, diode-connected transistor 114 might have a threshold voltage of about 0.8 Volts when the back-bias voltage $V_{SB}$ is equal to 0 Volts. However, the threshold voltage of this transistor 114 might increase to 2.5 Volts when the back-bias voltage $V_{SB}$ is equal to 10 Volts.

Second, the gate-to-bulk voltages $V_{GB}$ of the diode-connected transistors closer to output terminal 125 become undesirably large, thereby resulting in gate oxide stress within these transistors.

Several circuit topologies have been developed to reduce the impact of these effects, including those described in U.S. Pat. No. 5,982,224, U.S. Pat. No. 5,986,947, U.S. Pat. No. 6,191,963, U.S. Pat. No. 6,037,622, and P. Favrat et al., "A High-Efficiency CMOS Voltage Doubler", IEEE Journal of Solid State Circuits, Vol. 33, No. 4, pp. 410–416, March 1998.

FIG. 2A is a circuit diagram of another conventional charge pump circuit 200. Charge pump circuit 200 includes NMOS transistors 201–208 and capacitors 211–218, which are arranged into charge pump stages 221–224 as illustrated. Clock signals $C_1$–$C_4$ are used to control charge pump circuit 200. Charge pump stage 221 receives the $V_{DD}$ supply voltage, and charge pump stage 224 provides the boosted output voltage $V_O$. NMOS transistors 201–204 replace the diode-connected transistors 111–115 of charge pump circuit 100.

FIG. 2B is a waveform diagram illustrating clock signals $C_1$–$C_4$, which vary from a low voltage of 0 Volts to a high voltage of $V_{DD}$. Charge pump stages 221 and 223 are controlled by clock signals $C_1$ and $C_3$, and charge pump stages 222 and 224 are controlled by clock signals $C_2$ and $C_4$. In general, charge pump stage 221 operates as follows. When the clock signal $C_1$ has a logic low state (0 Volts) and the clock signal $C_3$ has a logic high state ($V_{DD}$), transistor 201 is turned on and transistor 205 is turned off. At this time, capacitor 212 is charged to a voltage of $V_{DD}$ through transistor 201. Note that capacitor 211 (which was previously charged to a voltage of $V_{DD}$) applies a voltage of about $2V_{DD}$ to the gate of transistor 201 at this time.

When the clock signal $C_1$ has a logic high state ($V_{DD}$) and the clock signal $C_3$ has a logic low state (0 Volts), transistor 201 is turned off, and transistor 205 is turned on, thereby charging capacitor 211 to a voltage of $V_{DD}$. At this time, capacitor 212, which was previously charged to a voltage of $V_{DD}$, discharges, thereby providing a boosted voltage of about $2V_{DD}$ to the next charge pump stage 222.

Charge pump stages 222–224 operate in a similar manner as charge pump stage 221, with the capacitors 213–218 charging to successively higher voltages in each stage. Charge pump circuit 200 is described in more detail in A. Umezawa et al., "A 5-V-Only Operation 0.6-μm Flash EEPROM with Row Decoder Scheme in Triple-Well Structure", IEEE J. Solid-State Circuits, Vol. 27, No. 11, pp. 1540–1546, November 1992.

Charge pump circuit 200 is commonly used as circuits such as that described in T. Tanzawa et al., "Circuit Techniques for a 1.8V-only NAND Flash Memory", IEEE J. Solid-State Circuits, Vol. 37, No. 1, January 2002.

However, charge pump circuit 200 exhibits the following deficiencies. The voltages on capacitors 211–218 become progressively greater from charge pump stage 221 to charge pump stage 224. As a result, the back-bias voltages $V_{SB}$ of transistors 201–204 become progressively greater from transistor 201 to transistor 204. Thus, the threshold voltages of transistors 201–204 also become progressively greater from transistor 201 to transistor 204. When the threshold voltage of one of transistors 201–204 becomes greater than the $V_{DD}$ supply voltage (i.e., the high level of the $C_1$–$C_4$ clock signals), then charge pump circuit 200 is no longer able to boost the output voltage $V_O$.

Moreover, the gate-to-bulk voltages $V_{GB}$ of the transistors 204 and 208 in the last output stage 224 become undesirably large, thereby resulting in gate oxide stress within these transistors.

It would therefore be desirable to have a charge pump circuit that is capable of overcoming the deficiencies of the above-described circuits.

SUMMARY

Accordingly, the present invention provides a charge pump stage that includes four n-channel transistors and two capacitors. A first n-channel transistor has a source region coupled to an input terminal of the charge pump stage, and a drain region coupled to an output terminal of the charge pump stage. A second n-channel transistor has a source region coupled to the input terminal, a drain region coupled to the gate of the first n-channel transistor, and a gate coupled to the output terminal. A third n-channel transistor has a source coupled to the input terminal, a gate coupled to the output terminal, and a drain coupled to a p-well. A fourth n-channel transistor has a source coupled to the output terminal, a gate coupled to the input terminal, and a drain coupled to the p-well.

The first, second, third and fourth n-channel transistors are all fabricated in the p-well. The p-well is formed using a triple-well process, wherein the p-well is surrounded by an n-well region, which is surrounded by a p-type substrate. Advantageously, the triple-well process is typically used to fabricate EEPROM cells. As a result, the charge pump stage can be fabricated on the same chip as EEPROM cells, without requiring process modifications.

A first capacitor is coupled to the output terminal, and a second capacitor is coupled to the gate of the first n-channel transistor. The first capacitor is coupled to receive a first clock signal and the second capacitor is coupled to receive a second clock signal. The first and second clock signals are controlled to charge and discharge the first and second capacitors.

Thus, the first capacitor charges through the first n-channel transistor during a first time period. During the first time period, the second capacitor applies a high voltage to the gate of the first n-channel transistor, thereby turning on this transistor.

During a second time period, the first capacitor discharges to the output terminal, and the second capacitor is charged through the second n-channel transistor.

The third n-channel transistor couples the p-well to the input terminal when the output terminal is at a higher voltage than the input terminal (i.e., when the first capacitor is discharging). Similarly, the fourth n-channel transistor couples the p-well to the output terminal when the input terminal is at a higher voltage than the output terminal (i.e., when the first capacitor is charging). As a result, the p-well is always held at a voltage equal to the lower of the source voltage or the drain voltage of the first n-channel transistor. Thus, the source-to-body voltage of the first n-channel transistor is always zero. As a result, the charge pump stage of the present invention does not exhibit a threshold voltage increase due to the presence of a back bias voltage. Consequently, the charge pump stage of the present invention can efficiently provide a boosted output voltage at the output terminal, even if numerous charge pump stages are connected in series. Moreover, by controlling the p-well voltage in the above-described manner, the charge pump stage of the present invention advantageously limits the gate-to-bulk voltage of the first n-channel transistor.

A charge pump circuit can be created by coupling a plurality of the above-described charge pump stages in series. In this case, each of the charge pump stages has an isolated p-well region, fabricated using the triple-well process.

The present invention will be more fully understood in view of the following description and drawings.

DETAILED DESCRIPTION

Figure 3:
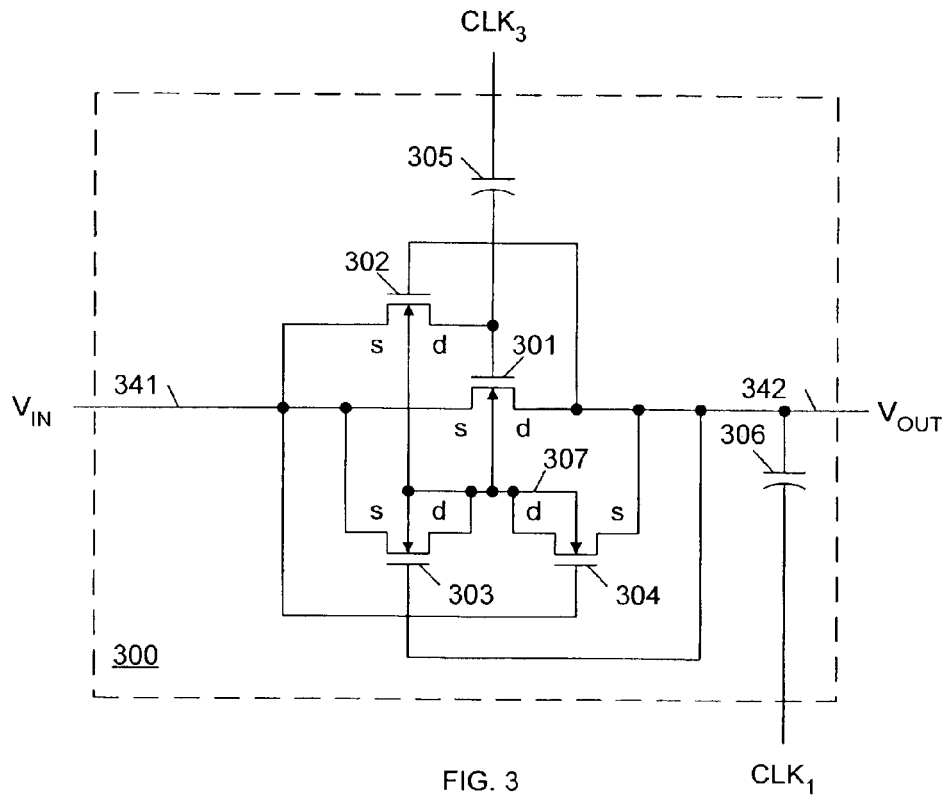
FIG. 3 is a circuit diagram of a charge pump stage in accordance with one embodiment of the present invention.

FIG. 3 is a circuit diagram of a charge pump stage 300 in accordance with one embodiment of the present invention. Charge pump stage 300 includes n-channel MOS transistors 301–304, capacitors 305–306, input terminal 341 and output terminal 342. N-channel transistors 301–304 are fabricated in a p-well region 307. In the described embodiment, charge pump stage 300 is fabricated using a triple well process, wherein p-well region 307 is fabricated in a surrounding n-well region (not shown). The n-well region is located in a p-type substrate (not shown).

Because a triple-well process is typically used to fabricate EEPROM cells, charge pump stage 300 can be fabricated on the same chip as EEPROM cells without requiring process modifications. Charge pump stage 300 can then be used to generate the voltages required to operate the EEPROM cells.

N-channel transistor 301 is connected in series between input terminal 341 and output terminal 342. More specifically, the source of n-channel transistor 301 is coupled to input terminal 341 and the drain of n-channel transistor 301 is coupled to output terminal 342. Input terminal 341 is configured to receive an input voltage $V_{IN}$, and output terminal 342 is configured to provide an output voltage $V_{OUT}$. The gate of n-channel transistor 301 is coupled to one terminal of capacitor 305, while the other terminal of capacitor 305 is coupled to receive the clock signal $CLK_3$.

N-channel transistor 302 is connected between the gate and source of n-channel transistor 301. More specifically, the source of transistor 302 is coupled to the source of transistor 301, and the drain of transistor 302 is coupled to the gate of transistor 301. The gate of n-channel transistor 302 is coupled to the drain of n-channel transistor 301. The drain of n-channel transistor 301 is also coupled to a terminal of capacitor 306. The other terminal of capacitor 306 is coupled to receive the clock signal $CLK_1$.

N-channel transistors 301–304 are all located in p-well region 307. N-channel transistor 303 is coupled between input terminal 341 and p-well region 307. More specifically, the source of transistor 303 is coupled to input terminal 341, and the drain of transistor 303 is coupled to p-well region 307. The gate of n-channel transistor 303 is coupled to output terminal 342, such that the gate of n-channel transistor 304 receives the output voltage $V_{OUT}$.

N-channel transistor 304 is coupled between output terminal 342 and p-well region 307. More specifically, the source of transistor 304 is coupled to output terminal 342, and the drain of transistor 304 is coupled to p-well region 307. The gate of n-channel transistor 304 is coupled to input terminal 341, such that the gate of n-channel transistor 304 receives the input voltage $V_{IN}$.

In general, n-channel transistors 303 and 304 control the voltage of p-well region 307. For example, if the input voltage $V_{IN}$ is greater than the output voltage $V_{OUT}$, then transistor 304 will have a positive gate-source voltage $V_{GS}$, and transistor 303 will have a negative gate-source voltage $V_{GS}$. If $V_{IN}$ minus $V_{OUT}$ is greater than the threshold voltage of transistor 304, then transistor 304 will be turned on, and transistor 303 will be turned off. Under these conditions, transistor 304 connects p-well 307 to the relatively low output voltage $V_{OUT}$.

Conversely, if the output voltage $V_{OUT}$ is greater than the input voltage $V_{IN}$, then transistor 303 will have a positive gate-source voltage $V_{GS}$, and transistor 304 will have a negative gate-source voltage $V_{GS}$. If $V_{OUT}$ minus $V_{IN}$ is greater than the threshold voltage of transistor 303, then transistor 303 will be turned on, and transistor 304 will be turned off. Under these conditions, transistor 303 connects p-well 307 to the relatively low input voltage $V_{IN}$.

As a result, p-well 307 is always connected to the lower of the $V_{IN}$ and $V_{OUT}$ voltages. As a result, the source-to-bulk voltage $V_{SB}$ of transistor 301 is maintained at 0 Volts, thereby totally eliminating the body effect within transistor 301. As a result, transistor 301 does not experience an increased threshold voltage. In addition, the gate-to-bulk voltage $V_{GB}$ of transistor 301 is advantageously limited to two times the $V_{DD}$ supply voltage. As a result, the gate dielectric of transistor 301 is not subject to excessive stress.

Figure 4:
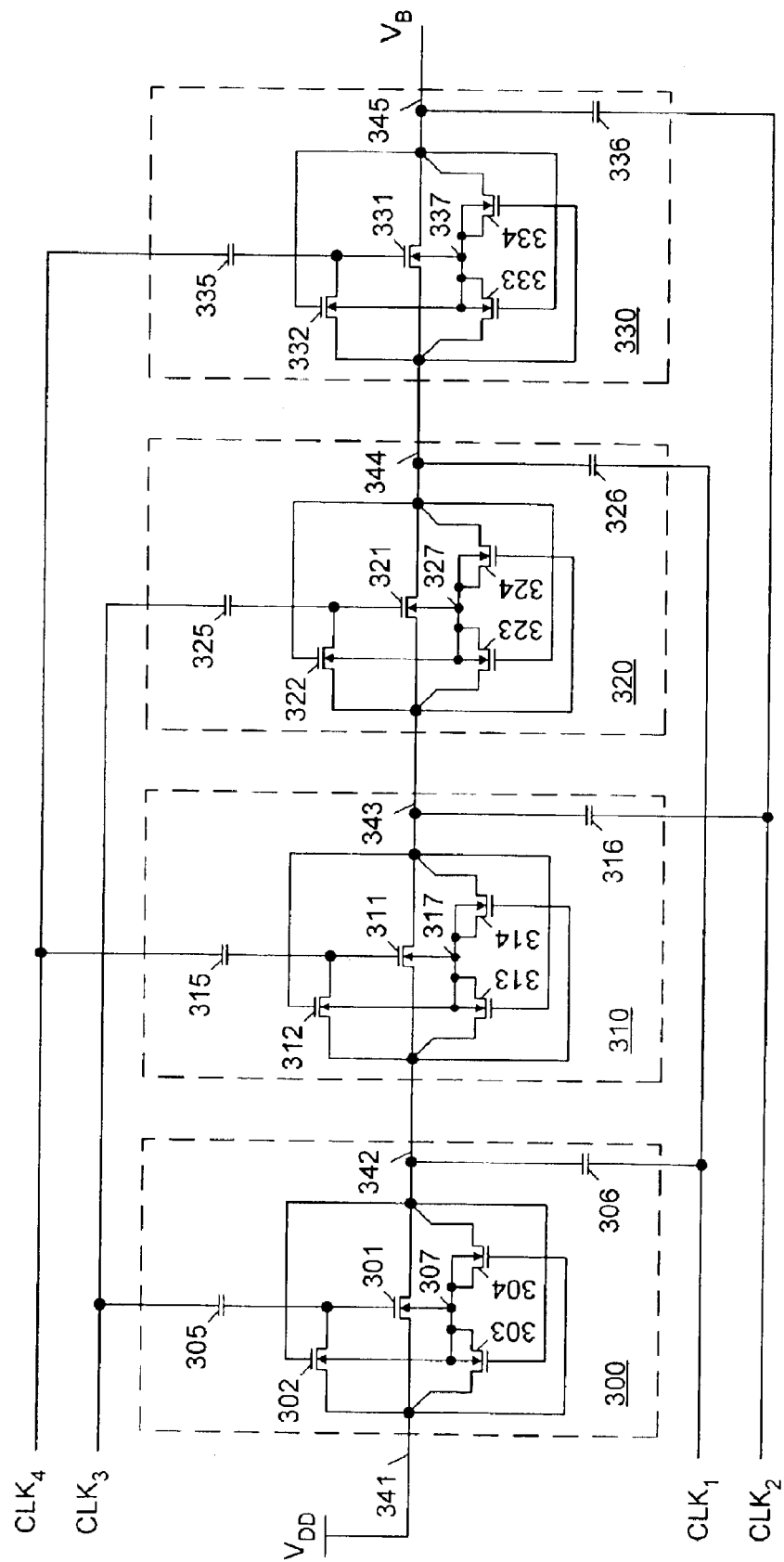
FIG. 4 is a circuit diagram illustrating four charge pump stages identical to the charge pump stage of FIG. 3, connected in series to form a charge pump circuit.

FIG. 4 is a circuit diagram illustrating four charge pump stages 300, 310, 320 and 330 connected in series to form a charge pump circuit 400. Charge pump stage 300 was described above in connection with FIG. 3. Charge pump stage 310 includes n-channel transistors 311–314, capacitors 315–316 and p-well region 317. Charge pump stage 320 includes n-channel transistors 321–324, capacitors 325–326 and p-well region 327. Charge pump stage 330 includes n-channel transistors 331–334, capacitors 335–336 and p-well region 337. Charge pump stages 310, 320 and 330 are configured in the same manner as charge pump stage 300 (FIG. 3). P-well regions 307, 317, 327 and 337 are isolated from each other by a surrounding n-well region (not shown). The output terminal 342 of charge pump stage 300 is also the input terminal of charge pump stage 310. Similarly, the output terminal 343 of charge pump stage 310 is also the input terminal of charge pump stage 320, and the output terminal 344 of charge pump stage 320 is also the input terminal of charge pump stage 330. The output terminal 345 of charge pump stage 330 provides a boosted output voltage $V_B$.

Charge pump stages 300 and 320 are configured to operate in response to the $CLK_1$ and $CLK_3$ clock signals, while charge pump stages 310 and 330 are configured to operate in response to the $CLK_2$ and $CLK_4$ clock signals. Although the present example illustrates four charge pump stages, it is understood that other numbers of charge pump stages can be used in other embodiments.

Figure 5:
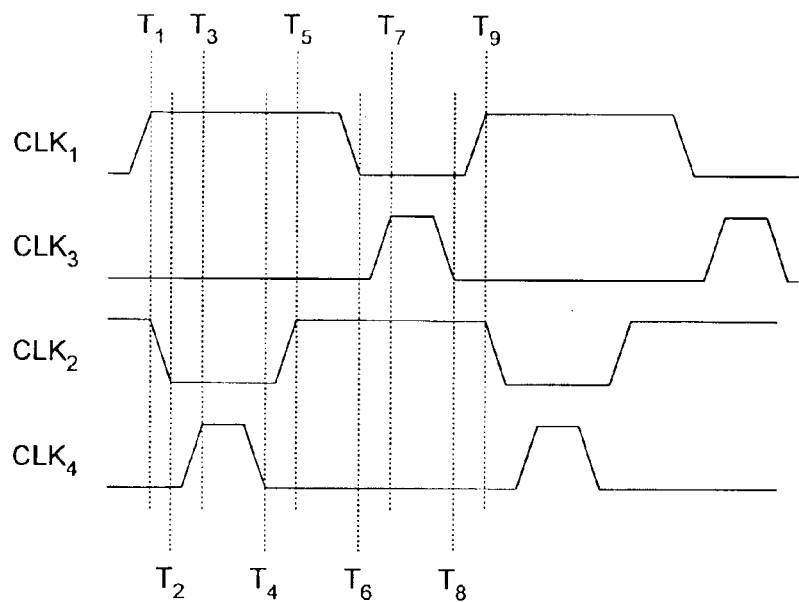
FIG. 5 is a waveform diagram illustrating clock signals which are used to control the charge pump circuit of FIG. 4 in accordance with one embodiment of the present invention.

FIG. 5 is a waveform diagram illustrating clock signals $CLK_1$–$CLK_4$, which are used to control charge pump circuit 400 in accordance with one embodiment of the present invention.

Overlapping clock signals $CLK_1$ and $CLK_2$ are used to boost the charge towards the output terminal 345 of charge pump circuit 400. The $CLK_3$ signal, which is only high when the $CLK_1$ signal is low, is used to drive the gates of n-channel transistors 301 and 321. Similarly, the $CLK_4$ signal, which is only high when the $CLK_2$ signal is low, is used to drive the gates of n-channel transistors 311 and 331.

In general, when the $CLK_1$ signal has a logic low state and the $CLK_3$ signal has a logic high state, transistor 301 is turned on and transistor 302 is turned off, thereby allowing capacitor 306 to charge, and capacitor 305 to discharge. Conversely, when the $CLK_3$ signal has a logic low state, and the $CLK_1$ signal has a logic high state, transistor 301 is turned off and transistor 302 is turned on, thereby allowing capacitor 305 to charge, and capacitor 306 to discharge. When normal operating conditions have been reached, capacitors 305 and 306 will each charge to a maximum voltage of about $V_{DD}$, and then discharge at a maximum voltage of about $2V_{DD}$.

Thus, at time $T_1$, $CLK_3$ signal has a logic low state, and $CLK_1$ signal has a logic high state. Under these conditions, capacitor 306 (which was previously charged to $V_{DD}$ during a previous cycle) provides a voltage equal to $2V_{DD}$ to the gate of transistor 302, and capacitor 305 provides a voltage of about 0 Volts to the drain region of transistor 302. Under these conditions, transistor 302 turns on to charge capacitor 305 from the $V_{DD}$ voltage supply terminal (i.e., input terminal 341). Transistor 301 is turned off under these conditions.

At this time, the voltage on output terminal 342 is significantly greater than the voltage on input terminal 341. As a result, transistor 303 turns on, thereby causing p-well 307 to be biased by the $V_{DD}$ supply voltage. As a result, transistor 302 does not exhibit any back bias voltage, which could undesirably increase the threshold voltage of this transistor 302. Moreover, because p-well 307 is held at a voltage of $V_{DD}$, the gate-to-bulk voltage of transistor 302 is advantageously limited to $V_{DD}$. (i.e., $2V_{DD}-V_{DD}$).

At time $T_6$, the $CLK_1$ signal transitions to a logic low state, and at time $T_7$, the $CLK_3$ signal transitions to a logic high state. Under these conditions, capacitor 305 (which was previously charged to a voltage of $V_{DD}$) applies a voltage of about $2V_{DD}$ to the gate of transistor 301. As a result, transistor 301 turns on, thereby charging capacitor 306 from the $V_{DD}$ voltage supply terminal (i.e., input terminal 341). Transistor 302 is turned off under these conditions.

At this time, the voltage on input terminal 341 may be slightly greater than the voltage on output terminal 342. As a result, transistor 304 may turn on, thereby causing p-well 307 to be biased by the voltage on output terminal 342 (i.e., the $V_{DD}$ supply voltage). As a result, transistor 301 does not exhibit any back-bias voltage, which could undesirably increase the threshold voltage of this transistor 301. Moreover, because p-well 307 is held at a voltage of $V_{DD}$, the gate-to-bulk voltage of transistor 301 is advantageously limited to a voltage of about $V_{DD}$. (i.e., $2V_{DD}-V_{DD}$).

At time $T_8$, the $CLK_3$ signal transitions to a logic low state, and at time $T_9$, the $CLK_1$ signal transitions to a logic high state. The above-described process is then repeated in charge pump stage 300.

Turning now to charge pump stage 310, at time $T_1$, the $CLK_2$ signal has a logic high state, and the $CLK_4$ signal has a logic low state. Under these conditions, capacitor 316 (which was previously charged to a voltage of about $2V_{DD}$ during a previous cycle) provides a voltage equal to $3V_{DD}$ to the gate of transistor 312 (i.e., terminal 343), and capacitor 315 provides a voltage equal to 0 Volts to the drain region of transistor 312. Under these conditions, transistor 302 turns on to charge capacitor 315 from the voltage on terminal 342 (which, as described above, is equal to about $2V_{DD}$ at this time) Transistor 311 is turned off under these conditions.

At this time, the voltage on output terminal 343 is significantly greater than the voltage on terminal 342. As a result, transistor 313 turns on, thereby causing p-well 317 to be biased by the voltage on terminal 342 (i.e., $2V_{DD}$). As a result, transistor 312 does not exhibit any back-bias voltage, which could undesirably increase the threshold voltage of this transistor 312. Moreover, because p-well 317 is held at a voltage of $2V_{DD}$, the gate-to-bulk voltage of transistor 312 is advantageously limited to $V_{DD}$. (i.e., $3V_{DD}-2V_{DD}$).

At time $T_2$, the $CLK_2$ signal transitions to a logic low state, and at time $T_3$, the $CLK_4$ signal transitions to a logic high state. Under these conditions, capacitor 315 (which was previously charged to a voltage of $2V_{DD}$) applies a voltage of $3V_{DD}$ to the gate of transistor 311. As a result, transistor 311 turns on, thereby charging capacitor 316 from the voltage on terminal 342 (i.e., $2V_{DD}$). Transistor 312 is turned off under these conditions.

At this time, the voltage on terminal 342 may be slightly greater than the voltage on terminal 343. As a result, transistor 314 may turn on, thereby causing p-well 317 to be biased by the voltage charging capacitor 316 (i.e., $2V_{DD}$). As a result, transistor 311 does not exhibit any back-bias voltage, which could undesirably increase the threshold voltage of this transistor 311. Moreover, because p-well 317 is held at a voltage of $2V_{DD}$, the gate-to-bulk voltage of transistor 301 is advantageously limited to $V_{DD}$. (i.e., $3V_{DD}-2V_{DD}$).

At time $T_4$, the $CLK_4$ signal transitions to a logic low state, and at time $T_5$, the $CLK_2$ signal transitions to a logic high state. The above-described process is subsequently repeated in charge pump stage 310.

Turning now to charge pump stage 320, at time $T_1$, $CLK_3$ signal has a logic low state, and $CLK_1$ signal has a logic high state. Under these conditions, capacitor 326 (which was previously charged to $3V_{DD}$ during a previous cycle) provides a voltage equal to $4V_{DD}$ to the gate of transistor 322 (i.e., terminal 344), and capacitor 325 provides a voltage equal to 0 Volts to the drain region of transistor 322. Under these conditions, transistor 322 turns on to charge capacitor 325 from the voltage of about $3V_{DD}$ on terminal 343. Transistor 321 is turned off under these conditions.

At this time, the voltage on terminal 344 is significantly greater than the voltage on terminal 343. As a result, transistor 323 turns on, thereby causing p-well 327 to be biased by the voltage on terminal 343 (i.e., $3V_{DD}$). As a result, transistor 322 does not exhibit any back-bias voltage, which could undesirably increase the threshold voltage of this transistor 322. Moreover, because p-well 327 is held at a voltage of $3V_{DD}$, the gate-to-bulk voltage of transistor 322 is advantageously limited to $V_{DD}$. (i.e., $4V_{DD}-3V_{DD}$).

At time $T_6$, the $CLK_1$ signal transitions to a logic low state, and at time $T_7$, the $CLK_3$ signal transitions to a logic high state. Under these conditions, capacitor 325 (which was previously charged to a voltage of $3V_{DD}$) applies a voltage of $4V_{DD}$ to the gate of transistor 321. As a result, transistor 321 turns on, thereby charging capacitor 326 from the $3V_{DD}$ voltage on terminal 343. Transistor 322 is turned off under these conditions.

At this time, the voltage on terminal 343 may be slightly greater than the voltage on terminal 344. As a result, transistor 324 may turn on, thereby causing p-well 327 to be biased by the voltage charging capacitor 326 (i.e., $3V_{DD}$). As a result, transistor 321 does not exhibit any back-bias voltage, which could undesirably increase the threshold voltage of this transistor 321. Moreover, because p-well 327 is held at a voltage of $3V_{DD}$, the gate-to-bulk voltage of transistor 321 is advantageously limited to $V_{DD}$. (i.e., $4V_{DD}-3V_{DD}$).

At time $T_8$, the $CLK_3$ signal transitions to a logic low state, and at time $T_9$, the $CLK_1$ signal transitions to a logic high state. The above-described process is then repeated in charge pump stage 320.

Finally, turning to charge pump stage 330, at time $T_1$, the $CLK_2$ signal has a logic high state, and the $CLK_4$ signal has a logic low state. Under these conditions, capacitor 336 (which was previously charged to $4V_{DD}$ during a previous cycle) provides a boosted output voltage $V_B$ equal to $5V_{DD}$ to the gate of transistor 332 (i.e., output terminal 345), and capacitor 335 provides a voltage equal to 0 Volts to the drain region of transistor 332. Under these conditions, transistor 332 turns on to charge capacitor 335 from the voltage on terminal 344 (which, as described above, is equal to $4V_{DD}$ at this time). Transistor 331 is turned off under these conditions.

At this time, the voltage on output terminal 345 is significantly greater than the voltage on terminal 344. As a result, transistor 333 turns on, thereby causing p-well 337 to be biased by the voltage on terminal 343 (i.e., $4V_{DD}$). As a result, transistor 332 does not exhibit any back bias voltage, which could undesirably increase the threshold voltage of this transistor 332. Moreover, because p-well 337 is held at a voltage of $4V_{DD}$, the gate-to-bulk voltage of transistor 332 is advantageously limited to $V_{DD}$. (i.e., $5V_{DD}-4V_{DD}$).

At time $T_2$, the $CLK_2$ signal transitions to a logic low state, and at time $T_3$, the $CLK_4$ signal transitions to a logic high state. Under these conditions, capacitor 335 (which was previously charged to a voltage of $4V_{DD}$) applies a voltage of $5V_{DD}$ to the gate of transistor 331. As a result, transistor 331 turns on, thereby charging capacitor 336 from the voltage on terminal 344 (i.e., $4V_{DD}$). Transistor 332 is turned off under these conditions.

At this time, the voltage on terminal 344 may be slightly greater than the voltage on terminal 345. As a result, transistor 334 may turn on, thereby causing p-well 337 to be biased by the voltage charging capacitor 336 (i.e., $4V_{DD}$). As a result, transistor 331 does not exhibit any back bias voltage, which could undesirably increase the threshold voltage of this transistor 331. Moreover, because p-well 337 is held at a voltage of $4V_{DD}$, the gate-to-bulk voltage of transistor 331 is advantageously limited to $V_{DD}$. (i.e., $5V_{DD}-4V_{DD}$).

At time $T_4$, the $CLK_4$ signal transitions to a logic low state, and at time $T_5$, the $CLK_2$ signal transitions to a logic high state. The above-described process is subsequently repeated in charge pump stage 330.

In the foregoing manner p-well regions 307, 317, 327 and 337 are always connected to the lowest voltages of the source/drain regions of transistors 301, 311, 321 and 331, respectively. As a result, the source-to-bulk voltages $V_{SB}$ of these transistors are maintained at zero, totally canceling the body effect and reducing the gate-to-bulk voltages $V_{GB}$ of these transistors. In the described embodiment, the n-well region (in which the p-well regions are formed) is biased at a relatively high voltage (e.g., the output of the charge pump circuit, $V_B$) in order to prevent forward biasing of the n-well/p-well junctions.

Figure 1:
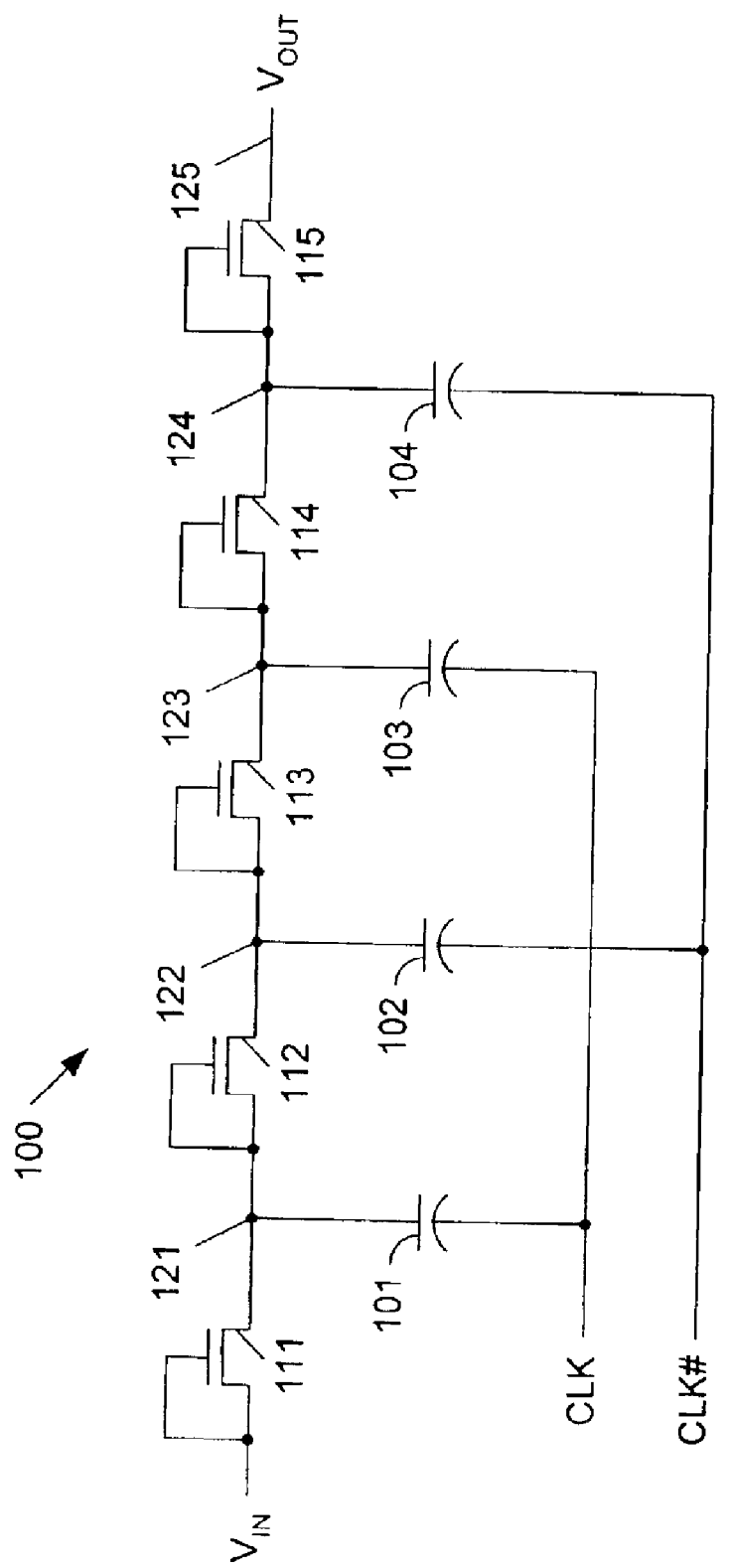
FIG. 1 is a circuit diagram of a conventional charge pump circuit.
Figure 2A:
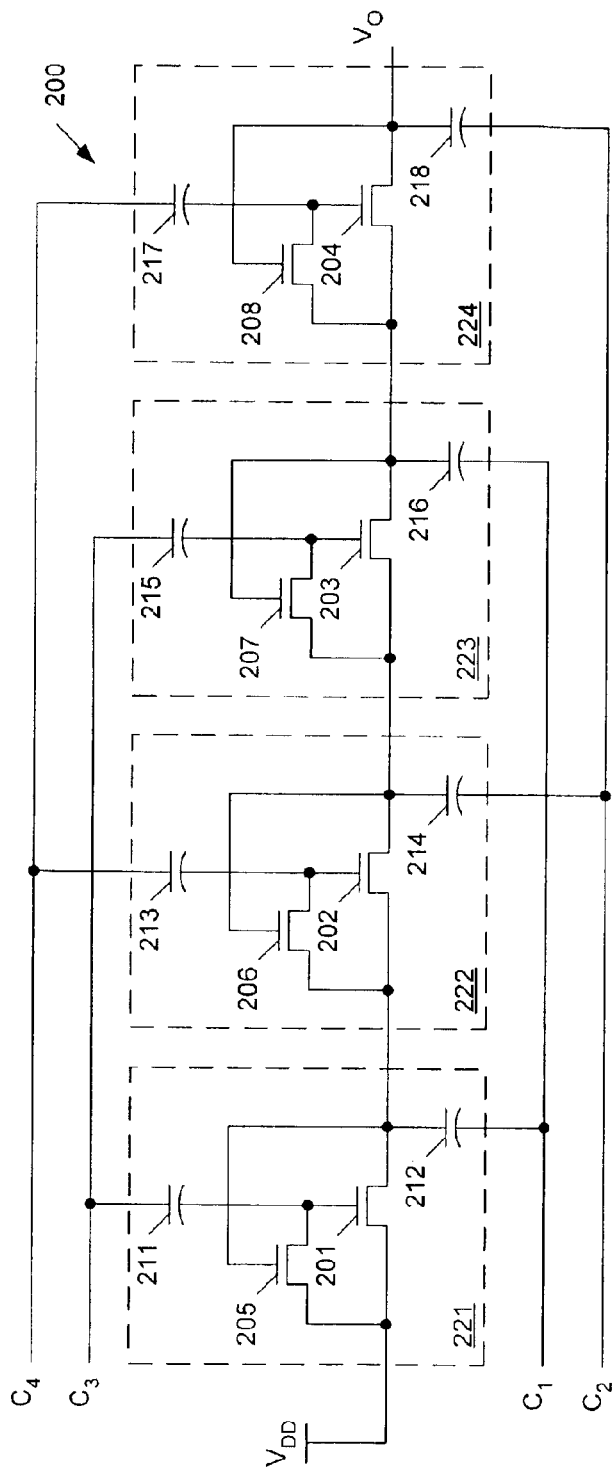
FIG. 2A is a circuit diagram of another conventional charge pump circuit.
Figure 2B:
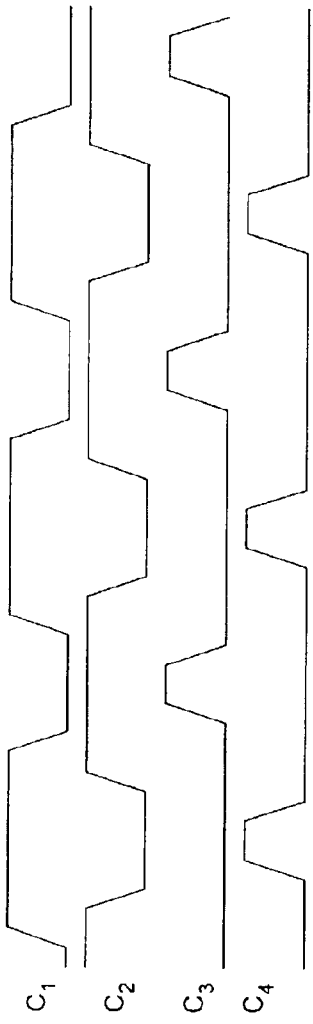
FIG. 2B is a waveform diagram illustrating clock signals used to operate the conventional charge pump circuit of FIG. 2A.
Figure 6:
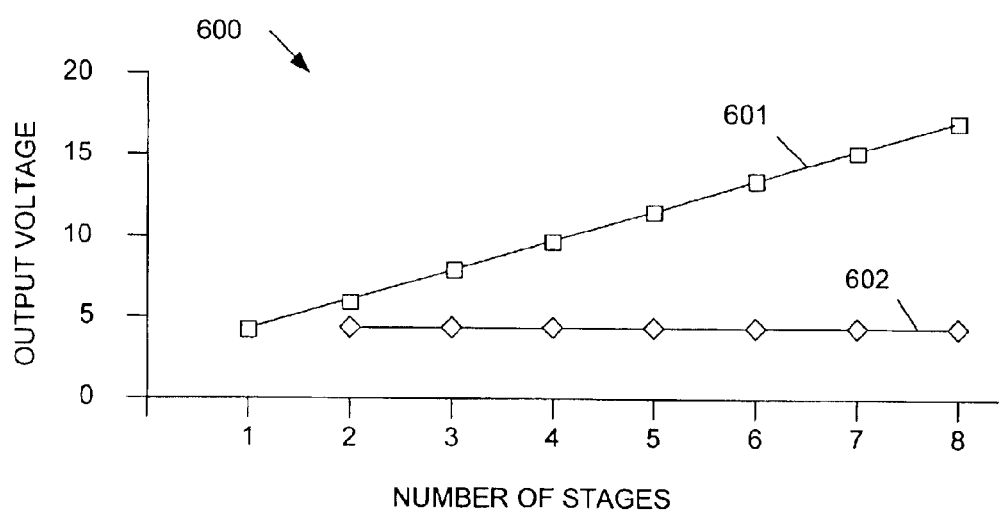
FIG. 6 is a graph that illustrates simulated output signals for the charge pump circuits of the type illustrated in FIGS. 2 and 4.

FIG. 6 is a graph 600 that illustrates simulated output signals for charge pump circuits of the type illustrated in FIGS. 2 and 4. This simulation assumes the use of 0.8 micron NMOS transistors, each having a threshold voltage of 1 Volt at $V_{SB}=0$ Volts. The X-axis of graph 600 represents the number of charge pump stages in the charge pump circuit, and the Y-axis represents the maximum output voltage of each stage. Line 601 represents the operation of the structure of FIG. 4 (i.e., charge pump circuit 400), while line 602 represents the operation of the structure of FIG. 2 (i.e., charge pump circuit 200). As can be seen by lines 601 and 602, charge pump circuit 200 saturates, while charge pump circuit 400 provides an output voltage that increases linearly with each additional stage. Note that while the output stage of the charge pump has not been shown, such an output stage is well known to those of ordinary skill in the art. Moreover, one of ordinary skill in the art would be able to create an output stage having a back bias control mechanism in accordance with the teachings of the present invention.

Although the present invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A charge pump stage comprising:
   a first n-channel transistor having a source coupled to an input terminal and a drain coupled to an output terminal;
   a second n-channel transistor having a source coupled to the input terminal, a drain coupled to a gate of the first n-channel transistor, and a gate coupled to the output terminal;
   a third n-channel transistor having a source coupled to the input terminal, a gate coupled to the output terminal, and a drain coupled to a p-well;
   a fourth n-channel transistor having a source coupled to the output terminal, a gate coupled to the input terminal, and a drain coupled to the p-well, wherein the first, second, third and fourth n channel transistors are fabricated in the p-well;
   a first capacitor coupled to the output terminal; and
   a second capacitor coupled to the gate of the first n-channel transistor.

2. The charge pump stage of claim 1, further comprising:
   a first clock terminal for receiving a first clock signal, wherein the first capacitor is coupled between the output terminal and the first clock terminal; and
   a second clock terminal for receiving a second clock signal, wherein the second capacitor is coupled between the gate of the first n-channel transistor and the second clock terminal.

3. The charge pump stage of claim 1, further comprising:
   an n-well surrounding the p-well; and
   a p-type region surrounding the n-well.

4. The change pump stage of claim 1, further comprising:
   a second well region surrounding the first well region, wherein the first and second well regions have different conductivity types; and
   a third well region surrounding the second well region, wherein the second and third well regions have different conductivity types.

5. A charge pump circuit comprising:
   a first charge pump stage that includes:
      a first n-channel transistor having a source coupled to a first input terminal and a drain coupled to a first output terminal;
      a second n-channel transistor having a source coupled to the first input terminal, a drain coupled to a gate of the first n-channel transistor, and a gate coupled to the first output terminal;
      a third n-channel transistor having a source coupled to the first input terminal, a gate coupled to the first output terminal, and a drain coupled to a first p-well;
      a fourth n-channel transistor having a source coupled to the first output terminal, a gate coupled to the first input terminal, and a drain coupled to the first p-well, wherein the first, second, third and fourth n-channel transistors are fabricated in the first p-well;
      a first capacitor coupled to the first output terminal; and
      a second capacitor coupled to the gate of the first n-channel transistor; and
   a second charge pump stage that includes:
      a fifth n-channel transistor having a source coupled to the first output terminal and a drain coupled to a second output terminal;
      a sixth n-channel transistor having a source coupled to the first output terminal, a drain coupled to a gate of the fifth n-channel transistor, and a gate coupled to the second output terminal;
      a seventh n-channel transistor having a source coupled to the first output terminal, a gate coupled to the second output terminal, and a drain coupled to a second p-well;
      a eighth n-channel transistor having a source coupled to the second output terminal, a gate coupled to the first output terminal, and a drain coupled to the second p-well, wherein the fifth, sixth, seventh and eighth n-channel transistors are fabricated in the second p-well;
      a third capacitor coupled to the second output terminal; and
      a fourth capacitor coupled to the gate of the fifth n-channel transistor.

6. The charge pump circuit of claim 5, further comprising:
   a first clock terminal for receiving a first clock signal, wherein the first capacitor is coupled between the first output terminal and the first clock terminal;
   a second clock terminal for receiving a second clock signal, wherein the second capacitor is coupled between the gate of the first n-channel transistor and the second clock terminal;
   a third clock terminal, for receiving a third clock signal, wherein the third capacitor is coupled between the second output terminal and the third clock terminal; and
   a fourth clock terminal for receiving a fourth clock signal, wherein the fourth capacitor is coupled between the gate of the fifth n-channel transistor and the fourth clock terminal.

7. The charge pump circuit of claim 5, further comprising:
   an n-well surrounding the first p-well and the second p-well; and
   a p-type region surrounding the n-well.

8. A charge pump stage comprising:
   a first transistor having a source coupled to an input terminal and a drain coupled to an output terminal;
   a second transistor having a source coupled to the input terminal, a drain coupled to a gate of the first transistor, and a gate coupled to the output terminal;

a third transistor having a source coupled to the input terminal, a gate coupled to the output terminal, and a drain coupled to a well region;

a fourth transistor baying a source coupled to the output terminal, a gate coupled to the input terminal, and a drain coupled to the well region, wherein the first and second transistors are fabricated in the well region;

a first capacitor coupled to the output terminal; and a second capacitor coupled to the gate of the first transistor.

9. The charge pump stage of claim 8, further comprising:

a first clock terminal for receiving a first clock signal, wherein the first capacitor is coupled between the output terminal and the first clock terminal; and a second clock terminal for receiving a second clock signal, wherein the second capacitor is coupled between the gate of the first transistor and the second clock terminal.

* * * * *